(12) United States Patent
Loubet et al.

(10) Patent No.: US 9,628,806 B2
(45) Date of Patent: Apr. 18, 2017

(54) METHOD OF CODING A MATRIX, IN PARTICULAR A MATRIX REPRESENTATIVE OF A FIXED OR VIDEO IMAGE

(71) Applicant: I-CES (INNOVATIVE COMPRESSION ENGINEERING SOLUTIONS), Paris (FR)

(72) Inventors: Bruno Loubet, Paris (FR); Nicolas Bessou, Sartrouville (FR)

(73) Assignee: JEAN-CLAUDE Colin, Versailles (FR)

( * ) Notice: Subject to any disclaimer, the term of this patent is extended or adjusted under 35 U.S.C. 154(b) by 0 days.

(21) Appl. No.: 14/433,224

(22) PCT Filed: Oct. 7, 2013

(86) PCT No.: PCT/FR2013/052369
§ 371 (c)(1),
(2) Date: Apr. 2, 2015

(87) PCT Pub. No.: WO2014/053791
PCT Pub. Date: Apr. 10, 2014

(65) Prior Publication Data
US 2015/0237348 A1    Aug. 20, 2015

(30) Foreign Application Priority Data
Oct. 5, 2012  (FR) ..................... 12 59484

(51) Int. Cl.
| | | |
|---|---|---|
| *G06K 9/36* | (2006.01) | |
| *G06K 9/46* | (2006.01) | |
| *H04N 19/14* | (2014.01) | |
| *H04N 19/176* | (2014.01) | |
| *H04N 19/182* | (2014.01) | |
| *H04N 19/65* | (2014.01) | |

(52) U.S. Cl.
CPC ........... *H04N 19/14* (2014.11); *H04N 19/176* (2014.11); *H04N 19/182* (2014.11); *H04N 19/65* (2014.11)

(58) Field of Classification Search
None
See application file for complete search history.

(56) References Cited

U.S. PATENT DOCUMENTS

| | | | | |
|---|---|---|---|---|
| 7,050,501 B2* | 5/2006 | Alvarez | .................... | H04N 5/21 348/701 |
| 7,269,220 B2* | 9/2007 | Alvarez | ................ | G06T 7/2053 348/E5.065 |
| 9,277,231 B2* | 3/2016 | Aiba | ..................... | H04N 19/593 |

FOREIGN PATENT DOCUMENTS

FR    WO 2012059124 A1 *  5/2012   ............. H03M 7/30

OTHER PUBLICATIONS

Written Opinion of the International Searching Authority in International Application No. PCT/FR2013/052369.
Answer to the Written Opinion of the International Searching Authority, dated Apr. 30, 2015, in International Application No. PCT/FR2013/052369.

(Continued)

*Primary Examiner* — Feng Niu
(74) *Attorney, Agent, or Firm* — Young & Thompson

(57) ABSTRACT

Method of differential compression of the values of a matrix, in which the reference cell is chosen in such a way that the difference between the initial value, contained in a cell to be compressed, and the decompressed value of the reference cell is a minimum.

18 Claims, 2 Drawing Sheets

(56) References Cited

OTHER PUBLICATIONS

Finnell, Damon, et al., "The JPEG Image Compression Algorithm P-151."
Shi, Yun Q., et al., "Image and Video Compression for Multimedia Engineering: Fundamentals, Algorithms, and Standards" Second Edition, 2007, CRC Press.

* cited by examiner

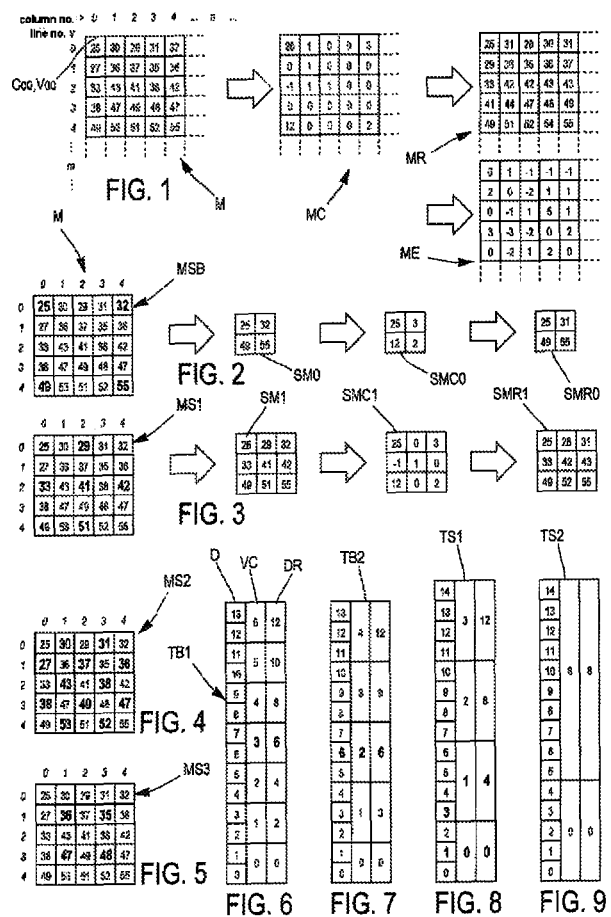

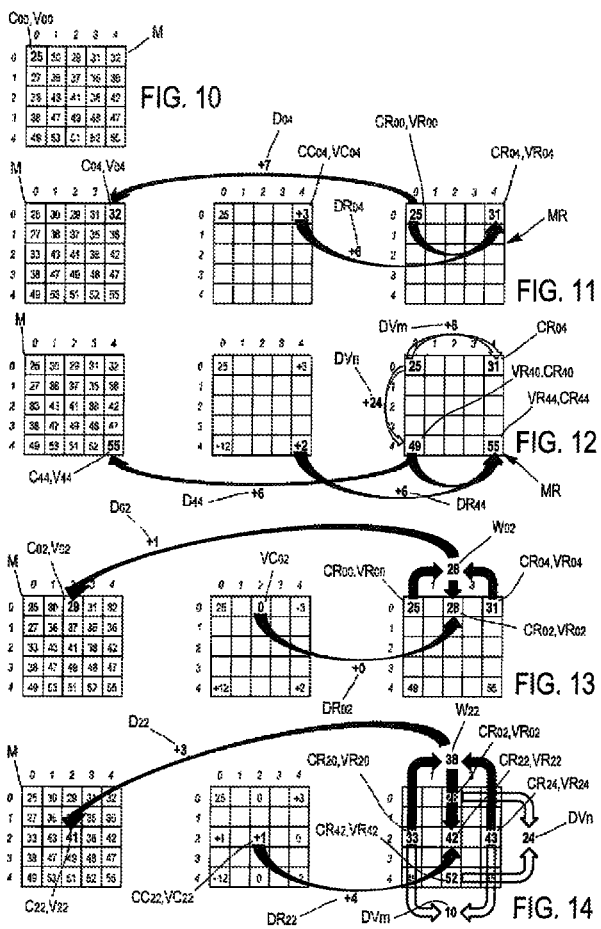

METHOD OF CODING A MATRIX, IN PARTICULAR A MATRIX REPRESENTATIVE OF A FIXED OR VIDEO IMAGE

BACKGROUND OF THE INVENTION

Field of the Invention

This invention relates to the field of coding digital values arranged in a matrix, in particular in the case where this matrix is a two-dimensional matrix, representing the pixels of an image.

The main constraints of the methods of compression are, on the one hand, to reduce as much as possible, by compressing it, the volume, measures in bytes, of an initial digital file and, on the other hand, to restore a file that is as close as possible to the initial file.

Description of the Related Art

Certain methods of compression make it possible to restore exactly the initial values. This is the case with DPCM modulation. According to this method, an original value, i.e. the first value of the initial digital file, is retained, then each other value is replaced with its difference with the value before it in the initial file. The numbers corresponding to the differences are generally smaller than those corresponding to the initial values, which makes it possible to obtain a compressed file. In order to restore an initial value, it is sufficient to add the difference corresponding to the previous initial value, i.e. the various successive values are added together with the origin value. This mode of compression therefore applies to a linear sequence, i.e. extending according to a single dimension, of numerical values; the same applies for a two-dimensional matrix of numerical values, formed of lines and columns, with this mode of compression able to be applied to each line of the matrix successively; the same applies regardless of the number of dimensions of a matrix, with the mode of compression able to be applied to each line (or the equivalent in the corresponding dimension) of the matrix.

It is admitted that it is the most substantial reduction in the differences between two initial values that makes it possible to obtain the highest compression ratio possible. It is as such that DPCM modulation was introduced. Nevertheless, the rate of compression obtained with the DPCM method remains low. The idea to apply an additional compression to the file of the differences thus appears attractive. However, the errors induced by this new compression are accumulated at the same time as, during the restitution, the successive differences are added together with the original value. According to the ADPCM (Adaptive DPCM) method, these errors are partially offset by using an algorithm that is supposed to predict these errors. This method remains unsatisfactory with regards to the compression rates that it is desirable to achieve.

Moreover, in the case of a matrix representing a fixed or video image, the processing of each image is done in blocks of 8×8 pixels, and in each block, line by line, from the first to the eighth. Such a method often results in a lineage and/or a pixelization of the restored image.

BRIEF SUMMARY OF THE INVENTION

The invention has for purpose to propose a simple and powerful method of compression that makes it possible to accumulate the advantages of a compression rate that is greater than that of the DPCM method alone, while still retaining therein the advantages of a differential coding, without error propagation, at the same time that it prevents or notably reduces the risk of lineage and/or of pixelization proper to the methods of prior art.

A method according to the invention, for the coding via successive layers of an initial matrix into a compressed matrix and its restoring as a restored matrix, with each cell of the initial matrix containing a respective initial digital value; with each cell of the compressed matrix containing a respective compressed digital value corresponding to the respective initial digital value; with each cell of the restored matrix containing a respective restored digital value corresponding to the respective initial digital value; characterised in that in order to process, i.e. compress, at least one initial value of an initial box, among the lines passing through said box, as a path of travel for the compression of said initial value, the one that, estimated using previously calculated restored values, has the lowest variation, is chosen.

Such a method can comprise at least one layer for which, for an initial value to be processed of said layer, the corresponding compressed value is determined by calculating a difference between said value to be processed and a previously determined and neighboring restored reference value, preferably the most neighboring, of the box provided to contain the restored value corresponding to said value to be processed on one of the lines passing through said box. When several of the lines passing through the cell provided to contain the restored value corresponding to said value to be processed comprise a value that can potentially be a reference value, for all of the combinations of potential values taken two by two, for a first of said potential reference values, located on a first of said lines and a second of said potential reference values, located on a second of said lines, a variation is calculated equal to the difference between said first value and another restored value, previously calculated, located on the same third line as said first value, said third line being parallel to the second line, and said other value being at the same distance from the first value as the second value is from the value to be processed, the reference value chosen being the second value for which said variation is the lowest. If the matrices are of two dimensions and when there are at least two possible reference values, one on the same line, the other on the same column for the value to be processed of the second layer, the choice of the reference value is made by:

- calculating a first variation between the first potential reference value that has the same column number as the value processed and the restored value that has the same line number as this first potential reference value and same column index as the second potential reference value; and,
- calculating a second variation between the second potential reference value that has the same line index as the value processed and the restored value that has the same column number as this second potential reference value and the same line number as said first potential reference value; then,
- choosing the reference value for which the path of travel gives the lowest variation, i.e. the first reference value is chosen if the second variation is less in absolute value than the first variation, or, the second reference value is chosen if the first variation is less in absolute value than the second variation.

There is advantageously at least one layer, preferably a base layer, for which, for an initial value to be processed of said layer, the corresponding compressed value is determined by calculating a difference between the initial value and a reference value equal to a previously calculated restored value, belonging either to the same line, or to the same column, as said value to be processed.

Preferably, there is at least one layer, for which, for an initial value to be processed, the reference value is calculated using a pair surrounding initial values having already been processed and arranged on either side of said value, for which the restored value is calculated using a reference value at decompression calculated using the equivalent surrounding pair of previously restored values. As an alternative, there is at least one layer for which, for an initial value to be processed of said layer, the reference value is calculated using a surrounding pair of restored values that have already been processed and arranged on either side of said value, for which the restored value is calculated using a reference value to the compression calculated using the same pair of previously restored values. In terms of another alternative, there is at least one layer for which, for an initial value to be processed of said layer, the corresponding compressed value is determined by calculating a difference between the initial value and a reference value determined using a surrounding pair of previously determined restored values, the surrounding pair chosen being that for which the two values of said pair, i.e. the variation, is the lowest. In one or the other of the cases, if there are at least two surrounding pairs, for calculating the reference value the pair is chosen for which the variation, equal to the difference between the corresponding restored values of previously determined restored values, has the lowest absolute value.

The reference value for this layer is advantageously the mathematical mean between the two values of the chosen surrounding pair and, where applicable, the reference value at the decompression is the mathematical mean between the restored values of the values of the surrounding pair; The reference value for this layer can alternatively be the mathematical mean between the two initial values corresponding to that of the chosen surrounding pair.

Advantageously, according to the method, there is an initial origin value of which the compressed value and the restored value are equal to said initial origin value, said restored original value serving as a reference value, either directly or indirectly, for the processing of the other initial values.

According to a preferred embodiment of the invention, a quantification table is applied to the difference between the initial value processed and the reference value, in order to calculate the compressed value and the restored value. Preferably, there are several quantification tables that can be used, with the quantification table used being defined using previously calculated restored values. Advantageously, there is a threshold, below which a first quantification table is applied and beyond which a second quantification table is applied. Preferably, according to whether the initial value to be processed belongs to one layer or another, one table or another is used.

Each cell can represent a pixel of an image.

BRIEF DESCRIPTION OF THE DRAWINGS

Several embodiments of the invention shall be described hereinafter, by way of non-restricted examples, in reference to the annexed drawings wherein:

FIG. 1 partially shows an initial matrix, representing the upper left corner of an image, as well as those of the compressed matrix and of the corresponding error matrix;

FIGS. 2 to 5 each show a layer of cells among the cells of the initial matrix;

FIGS. 6 and 7 show two quantification tables respectively for dark and light values of the image, that can be used during the compression of the values of the base layer;

FIGS. 8 and 9 show two quantification tables respectively for dark and light values of the image, that can be used during the compression of the values of the secondary layers; and, FIGS. 10 to 14 show algorithms used in the method according to the invention.

DETAILED DESCRIPTION OF THE PREFERRED EMBODIMENTS

A method according to the invention shall be described in its application to the digital compression of an image. In this example, the original image is shown in the figures by an initial matrix M. This matrix can be that of the values of a monochrome image, if the original image is monochrome, or one of the matrices making it possible to reconstitute a colour image, if the original image is in colour. In the case of a colour image, the initial matrix M can show, for each pixel, the luminosity of Red, Green or Blue, in the case of an initial image with notation RGB; it can represent values composed of luminance Y, in the case of an initial image with notation YCbCr. The values of the initial matrix M are between 0 and 255. As such, the matrix can be the representation of a raw image or that of an image that has already been subjected to a colorimetric transformation.

In the description which shall follow, "line" shall refer to the lines represented horizontally in the figures and "columns" shall refer to the lines represented vertically; of course, regardless of whether they are horizontal or vertical, the lines are treated indifferently according to the method.

In the description which shall follow, each cell Cmn of the initial matrix M is index by its line number m and its column number n and contains a corresponding initial value Vmn, indexed in the same way. To the initial matrix M corresponds a compressed matrix MC and a restored matrix MR after decompression of the compressed matrix MC. To each value Vmn of the initial matrix M corresponds a respective compressed value VCmn and a restored value VRmn, each one in a cell CCmn, CRmn respective of the same indices. In order to simplify the description, the method according to the invention shall be applied only to the upper left corner of the initial matrix M, therefore to the upper left corner of the corresponding image; by facility of language, in what follows the corner of each matrix is assimilated with the corresponding matrix, of which it is the illustration. The FIG. 1 therefore shows the initial matrix M, the compressed matrix MC and the restored matrix MR obtained, using the initial matrix M, by the method according to the invention described in reference to FIGS. 10 to 14; FIG. 1 also shows an error matrix ME constituted of the differences between the restored values and the initial values.

The method according to the invention allows for the successive coding of successive layers of values, using an original value Voo contained in an original cell Coo the highest on the left of the initial matrix M. The encoding of a value of a given layer depends solely on the previously encoded layers or on the previously encoded values of its own layer. In the example shown, the method utilise four layers, a base layer and three secondary layers.

In FIG. 2, the values of the cells that belong to the base layer are shown in bold in the matrix M; in FIG. 3, the values of the cells belonging to the first secondary layer are shown in bold in the matrix M; in FIG. 4, the values of the cells belonging to the second secondary layer are shown in bold in the matrix M; and, in FIG. 5, the values of the cells belonging to the third secondary layer are shown in bold in the matrix M. Note that, for each layer, the cells that it is comprised of are regularly distributed in the matrix.

In the example shown, the base layer is encoded using a first lossless differential encoding algorithm, followed by a first quantification; the secondary layers are encoded using a second predictive algorithm, itself followed by a second quantification. Two quantification tables TB1, TB2 are used for the quantification of the values of the base layer. Two other tables TS1, TS2 are used for the quantification of the values of the secondary layers. These tables are partially shown in FIGS. 6 to 9. The tables are only partially shown in these figures. In particular, they only show the values for positive differences and less than 13 or 14, according to the case; nevertheless, a compete table includes more preferably negative values and, in the case of an image coded over eight bits, allows for the encoding of differences D of which the values are between −255 and +255.

For each type of layer, a first table TB1, TS1 is allocated to the quantification of the dark values; with the values being considered as dark below a threshold value equal to 40, out of 255. The second tables TB2, TS2 are allocated to the light values, i.e. starting from 40 up to 255. The choice of the value 40 for the threshold value is arbitrary, determined by a better rendering of the darkest colours. The first tables TB1 and TS1 assign to the dark values quantifications that are less severe, corresponding to a division by 2 for the base layer and to a division by 4 for the secondary layers, compared to a division by 3 (TB2) and 5 or 8 (TS2) respectively for the light values. The degradations, i.e. the errors between the restored value and the initial value are generally more perceptible in the dark zones than in the light zones; such an arrangement, that makes it possible to have less losses in the dark zones is therefore particularly advantageous. The rest of this description explains, in reference to FIGS. 11 to 14, how it is determined whether a value is deemed light or dark.

For each table, the first column contains a difference to be quantified D, the second column contains, for each difference D, the corresponding compressed value VC, and, the third column contains the corresponding restored value DR of the difference D.

The number of layers defines a pitch p, q of the base layer, i.e. a distance between the cells that belong to the first layer. In the example shown, the pitch p according to the lines and the pitch q according to the columns are equal, with:

$$q=p=2^{(i-2)},$$

where "i" is the number of layers of the method.

In the example described, there are four layers, namely the base layer and the three secondary layers, i.e.:

$$p=q=2(4-2)=4.$$

As such, the cells of the base layer have for indices:

$m=4y$, with $y \geq 0$ $n=4Z$, with $z \geq 0$ and, $(y,z) \neq (0,0)$

The base cells therefore constitute a meshing among the cells of the initial matrix M, starting with which are calculated the compressed values of the other cells. By using for the values of the base cells an encoding that is little or not destructive with respect to the encoding of the other cells, regularly distributed throughout the entire image, restored values are thus retained that are sufficiently close to the initial values in order to retain a desired printing quality, while still allowing for a higher compression of the values of the secondary layers.

In the example shown, the upper left corner shown, corresponds to a mesh; with for each one of the cells shown:

$m \geq 4$ and $n \geq 4$

The method shall now be described according to the invention in reference to FIGS. 10 to 14. Each one of these figures shows the calculation of a compressed value VCmn, i.e. a step in the constitution of the compressed matrix MC, in particular according to the initial values Vmn, of the initial matrix M, but also according to the restored values VR of previously compressed values. FIGS. 11 and 12 each show the compression of a respective value among those of the cells of the base layer. The FIGS. 13 and 14 each show the compression of a respective value among those of the cells of the first secondary layer.

The method of compression/restitution according to the invention, retains the value Voo of the original cell Coo, identified in FIG. 10, in such a way that in the example shown, there is:

$$Voo=VCoo=VRoo=25$$

The restored original value VRoo is a reference, directly or indirectly, for the calculation of the other compressed VCmn or restored VRmn values, In reference to FIG. 11, the application of the method shall now be described according to the invention to the cell Co4 of the initial matrix M, more particularly to the value Vo4=32 that the cell Co4 contains. The cell Co4 belongs to the base layer. Other than the particular case of the value Voo, the value V04 is the first to be compressed.

In an embodiment of the invention, the restored value is taken for the reference value, already calculated, with the closest lower index on the same line or the same column. In the case here, the reference value is necessarily the value VRoo=25. As the reference value is less than 40, the value V04 is processed as a dark value and the first table TB1 is therefore used. The difference Do4=V04−VRoo=+7 is then calculated between the initial value to be processed Vo4 and the reference value VRoo; the compressed value VCo4=+3 and the restored difference DRo4=+6 are deduced from the table TB1 and from the difference D04=+7. The restored value VRo4=VRoo+DRo4=25+6=31 is then obtained, by adding the restored difference DRo4 to the reference value VRoo.

The same procedure is applied to the initial value V4o of the cell C4o of the initial matrix M. The same procedure can then be applied to all of the initial values Vo,4z and V4y,o.

In reference in FIG. 12, the application of the method shall now be described according to the invention to the cell C44 of the initial matrix M, more particularly to the value V44=55 that cell C44 contains. The cell C44 belongs to the base layer.

In an embodiment of the invention, the restored value is taken as the reference value, already calculated, with the closest lower index on the same line or the same column. In the case here, two values potentially respond to this definition, one VRo4 in the box CRo4, the other VR4o in the box CR4o of the matrix MR.

In order to make a choice between the two potential reference values:

the variation DVm=VRo4−VRoo=+6 is calculated between the first potential reference value VRo4 that has the same column index n=4 as the value V44 processed and the restored value VRoo that has the same line index m=o as this first potential reference value VRo4 and the same column index n=o as the second potential reference value VR4o; and, the variation DVn=VR4o−VRoo=+24 is calculated between the second potential reference value VR4o that has the same line index m=4 as the value V44 processed and the restored value VRoo that has the same column index n=o as this second potential reference value VR4o and the same line index m=o as the first potential reference value VRo4; then, a direction of travel of the matrix is determined, i.e. a direction according to which the reference value will be chosen, parallel to the lowest variation; in the case here, the lowest variation is that of DVm, according to the index line m=o, in such a way that the reference value of the same line index m is chosen as the value V44 processed, in such a way that the reference value chosen is the value VR4o, in the box CR4o of the restored matrix MR.

In the case of FIG. 12, the lowest variation is DVm=+6; the reference value is therefore the value VR4o=49. As the reference value is greater than 40, the value V44 is processed as a light value and the second table TB2 is therefore used. The difference D44=V44−VR4o=+6 is calculated between the initial value to be processed V44 and the reference value VC 44; the compressed value VCo4=+2 and the restored difference DR44=+6 are deduced from the table TB2 and from the difference D44=+6. The restored value VR44=VR4o+DR44=55 is then obtained, by adding the restored difference DR44 to the reference value VR4o.

In reference to FIGS. 13 and 14, the application of the method shall now be described according to the invention to cells of a secondary layer of the initial matrix M. The cells of each secondary layer are all framed by cells of the layer with a lower index (case of FIG. 13), or by cells of the same layer which themselves are framed by cells of the layer with a lower index (case of FIG. 14).

For the processing of the secondary layers, an average value between the values of a surrounding pair is chosen for the reference value; a surrounding pair being a pair of previously calculated restored values contained in the two most neighbouring boxes, on either side of the cell being processed, in the restored matrix MR, aligned on the same line m or on the same column n. This average is in this example rounded to the nearest integer.

FIG. 13 shows more particularly the processing of the value Vo2=29 that cell Co2 contains, belonging to the first secondary layer MS1 of the initial matrix M.

In the case here, the average value Wo2 is calculated between the previously calculated original values Voo, Vo4 contained in the two most neighbouring boxes Coo, Co4, on either side of the cell being processed Co2, aligned on the same index line m=o; with no surrounding pair existing on the index column n=2. From this reasoning is deduced the reference value: Wo2=(Voo+Vo4)/2=28.

In the same way, the reference value is calculated at the decompression WRo2, i.e. used during the restitution, between the corresponding restored values VRoo and VRo4 contained in the cells CRoo and CRo4, in order to obtain the reference value at decompression:

$$WRo2=(VRoo+VRo4)/2=28.$$

As the reference values at the compression and at the decompression were obtained with different values, the difference Do2=Vo2−Wo2=+1 is calculated between the initial value Vo2 being processed and the reference value at the decompression WRo2. As the reference value WRo2 is less than 40, it is processed as a dark value, using the first table TS1; the compressed value VCo2=0 is deduced from the table TS1; then the restored difference DRo2=+0 and then the restored value:

$$VRo2=WRo2+DRo2=28+0=+28$$

FIG. 14 shows more particularly the processing of the value V22=41 that the cell C22 contains, also belonging to the first secondary layer SM1 of the initial matrix M.

In the case here, there are two potential surrounding pairs (VRo2, VR42) and (VR2o, VR24) of restored values. In a manner similar to what was described in reference to FIG. 12, in order to choose the reference value, the direction of travel is first determined according to the previously calculated neighbouring restored values that have the lowest variation DV; in the case of secondary layers, the surrounding pair is chosen for which the values have the lowest variation DV. In the case here:

$$DVm=VR24−VR2o=+10, \text{ and}$$

$$DVn=24−Vro2=+24,$$

where DVm shows the variation according to the index line m=2 and DVn according to the index column n=2.

The variation DVm, according to the line, being the lowest, it is therefore the surrounding pair (VR2o, VR24) of the values located on the same index line m=2 as the value being processed which is chosen for calculating the reference value at the decompression WR22:

$$WR22=(VR2o+VR24)/2=(33+43)/2=38$$

The reference value at the compression W22 is then calculated using original values located in the equivalent cells:

$$W22=(V2o+V24)/2=(33+42)/2=37.5 \text{ rounded to } 38$$

As in the previously described case in reference to FIG. 13, the difference D22=V22−W22=+3 is calculated between the initial value V22 being processed and the reference value W22. As the reference value at the decompression WR22 is less than 40, it is processed as a dark value, using the first table TS1; the compressed value VC22=+1 is deduced from the table TS1; then the restored difference DR22=+4 and then the restored value:

$$VR22=WR22+DR22=38+4=+42$$

The same procedures, described previously in reference to FIGS. 13 and 14, apply to each of the values of the secondary layers.

Note that for each value to be restored VR, the reference values and the condition of clarity being determined using previously restored values VR of the restored matrix MR. In other words, the restored values are used to calculate the following restored values, to determine if applicable the direction of travel of the decompression for each value to be restored, and, to determine the quantification table which will be used according to the threshold value chosen. The compressed matrix MC therefore contains in itself all of the information needed for the restitution.

Furthermore, as shown particularly in FIGS. 2 and 3, it is possible to carry out the compression layer after layer. As such, as soon as each of the values of a layer is compressed, it is possible to transmit them, for example in the form of a sub-matrix SMCo to a device for their restitution, for example a computer screen. This makes it possible to display, although it is with a lesser definition, the entire image, without waiting for all of the layers to have been processed. This allows the user who wants to view a fixed image to have the impression of a faster processing; for the user watching a video, this allows for greater fluidity. Particularly in the case of a video viewed as streaming, in particular when the bandwidth is occasionally insufficient for the complete processing of an image before the display of the next one, this avoids the effect of pixelization that appears with a processing, as in certain encoding methods, such as H264.

Such an arrangement can also be advantageously used for a video game, particularly for a game played "on line", wherein rapid sessions can be sequenced at a high frequency; a processing of only one zone of the image, or a slowing down in the action, would be detrimental to the pleasure of the player, and even to the success of his actions; the processing of successive layers distributed in the image, with each layer being transmitted then displayed as soon as it is treated, makes it possible to prevent these disadvantages.

In the cases shown by the processing of the value Vo2, in reference to FIG. 13, or of the value V22, in reference to FIG. 14, and as an alternative, the corresponding compressed values can be calculated using the average of the restored values of the same indices mn as the surrounding pair, and, the restored values using these same values. In this embodiment of the invention, there is therefore:

for $V02$: $Wo2=WRO2=(VRoo+VRo4)/2=(25+31)/2=28$ then, $Do2=Vo2-Wo2=+1$ and $DRo2=0$ where, $VRo2=WRo2+DRo2=28+0=+28$ and, for $V22$: $W22=WR22=(VR2o+VR24)/2=(33+43)/2=38$ then, $D22=V22-W22=+3$ and $DR22=+4$ where, $VR22=WR22+DR22=38+4=+42$ with the values Wo2 and W22 being calculated a described previously in reference to FIGS. 13 and 14.

Of course, the invention is not limited to the examples that have just been described.

As such, instead of being in the upper left corner of the initial matrix, the original cell can be any other cell whatsoever of the initial matrix, in such a way that the line and/or column numbers can take negative values, with the principle of compression according to the invention not being affected thereof.

In addition, if the previously given example describes the compression of a matrix of which each cell shows a pixel of an image, a method of compression according to the invention is applicable to any type of matrix, in particular to that corresponding to large quantities of data, for example statistical data. Likewise, if the example corresponding to a two-dimensional matrix, symbolised one by the lines, and the other by columns, the invention is applicable to matrices of higher dimensions; in particular, a video can be represented by a three-dimensional matrix, with the third dimension representing time. Such a method of compression is, moreover, particularly suited for being used for the processing of massive amounts of data, for example meteorological data, that can be represented in the form of a two-dimensional matrix or higher.

In the example shown, the base layer has its own quantification tables and the quantification tables used for the compression of the secondary layers are identical for all the secondary layers. Of course, without these examples being restricted, it is also possible to provide quantification tables that are proper to each secondary layer, or even a single quantification table valid for all of the layers, including the base layer.

The order of processing of the initial values in each layer can be changed. It can be processed by successive lines or columns, or in another order. It can also be provided that a processing of a layer begins before the processing of the preceding layer is finished.

The invention claimed is:

1. A method of compressing a digital image, comprising the steps of:
    a first step of changing at least one layer (MSB, MS1, MS2, MS3) of an initial matrix (M) representing the digital image as obtained from an initial digital image file into a compressed matrix (MC) for a compressed digital image file,
    wherein each cell (Cmn) of the initial matrix (M) is indexed by a line number "m" and a column number "n" and contains an initial digital value (Vmn), and
    wherein each cell (CCmn) of the compressed matrix (MC) is indexed by the line number "m" and the column number "n" and contains a compressed digital value (VCmn) corresponding to the initial digital value (Vmn); and a second step of restoring, by decompression, the compressed matrix (MC) into a restored matrix (MR),
    wherein each cell (CRmn) of the restored matrix (MR) is indexed by the line number "m" and the column number "n" and contains a restored digital value (VRmn) corresponding to the initial digital value (Vmn),
    wherein each cell (Cmn, CCmn, CRmn) represents one pixel of the digital image,
    wherein in said first step of changing the at least one layer (MSB, MS1, MS2, MS3) of the initial matrix (M) into the compressed matrix (MC), for at least one cell (CRmn), the compressed digital value (VCmn) located in said at least one cell is calculated using a difference between the initial digital value (Vmn) located in said at least one cell, and a reference value calculated using only:
    i) at least one previously processed restored or initial digital value in the same line as said at least one cell (CRmn) or
    ii) an at least one previously processed restored or initial digital value in the same column as said at least one cell (CRmn), and
    wherein the selection of i) the same line or ii) the same column as said at least one cell (CRmn) is based on a comparison between
    a) a difference (DV) between two previously calculated restored digital values located on a same line, and
    b) a difference (DV) between two previously calculated restored digital values located on a same column.

2. The method according to claim 1, further comprising determining, for the initial digital value (Vmn) of the initial cell (Cmn) of the initial matrix (M), the corresponding compressed digital value (VCmn) by calculating a difference (Dmn) between said initial digital value (Vmn) and a previously determined and neighbouring restored reference value (VR), of the cell (CRmn) provided to contain the restored value corresponding to said value to be processed (Vmn), said neighbouring value being furthermore on one of the lines passing through said cell (CRmn).

3. The method according to claim 2,
    wherein the matrices are of two dimensions and when there are at least two possible reference values, on the same line (m), the other on the same column (n) for the value (Vmn) to be processed of the layer (MSB), the choice of the reference value is made by:

calculating a first variation (DVm) between the first potential reference value that has the same column number (n) as the value (Vmn) processed and the restored value having the same line number as this first potential reference value and the same column index as the second potential reference value; and, calculating the second variation (DVn) between the second potential reference value that has the same line index (m) as the value (Vmn) processed and the restored value that has the same column number as this second potential reference value and the same line number said first potential reference value; then, choosing the reference value for which the path of travel gives the lowest variation, i.e. the first reference value is chosen, on the same column (n), if the second variation (DVn) is less in absolute value than the first variation (DVm), or, the second reference value is chosen, on the same line (m), if the first variation (DVm) is less in absolute value than the second variation (DVn).

4. The method according to claim 3, wherein one base layer, for which, for an initial value (Vmn) to be processed of said base layer, the corresponding compressed value (VCmn) is determined by calculating a difference (Dmn) between the initial value (Vmn) and a reference value equal to a previously calculated restored value, belonging either to the same line (m), or to the same column (n), as said value to be processed.

5. The method according to claim 1, wherein one base layer, for which, for an initial value (Vmn) to be processed of said base layer, the corresponding compressed value (VCmn) is determined by calculating a difference (Dmn) between the initial value (Vmn) and a reference value equal to a previously calculated restored value, belonging either to the same line (m), or to the same column (n), as said value to be processed.

6. The method according to claim 1, wherein there is at least one layer (MS1, MS2, MS3 . . . ), for which, for an initial value to be processed (Vmn), the reference value (Wmn) is calculated using a surrounding pair of restored values (VRo2, VR42; VR2o, VR24) that have already been processed and arranged on either of said value (Vmn), for which the restored value (VRmn) is calculate using a reference value to decompression (WRmn) calculated using the same pair of previously restored values (VRo2, VR42; VR2o, VR24).

7. The method according to claim 1, wherein there is at least one layer (MS1, MS2, MS3 . . . ), for which, for an initial value to be processed (Vmn), the reference value (Wmn) is calculated using a pair surrounding initial values (Vo2, V42; V2o, V24) having already been processed and arranged on either side of said value (Vmn), for which the restored value (VRmn) is calculated using a reference value at decompression (WRmn) calculated using the equivalent surrounding pair of previously restored values (VRo2, VR42; VR2o, VR24).

8. The method according to claim 7, wherein when there are at least two surrounding pairs (Vo2, V42; V2o, V24; or; VRo2, VR42; VR2o, VR24) for calculating the reference value (W22, WR22) the pair is chosen for which the variation (DVmn), equal to the difference between the corresponding restored values (VRo2, VR42; VR2o, VR24) of previously determined restored values, has the lowest absolute value.

9. The method according to claim 7, wherein the reference value (Wmn) is the mathematical mean between the two values of the chosen surrounding pair (V2o, V24; VR2o, VR24) and, where applicable, the reference value (WRmn) at the decompression is the mathematical mean between the (VR2o, VR24) restored values of the values of the surrounding pair.

10. The method according to claim 1, wherein there is an initial origin value (Voo) of which the compressed value (VCoo) and the restored value (VRoo) are equal to said initial origin value (Voo), with said origin restored value (VRoo) serving as a reference value, either directly or indirectly, for the processing of the other initial values (Vmn).

11. The method according to claim 10, wherein there are several quantification tables that can be used (TB1, TB2, TS1, TS2), with the quantification table used being defined using previously calculated restored values.

12. The method according to claim 11, wherein the quantification table is chosen according to the reference value (WRmn) only.

13. The method according to claim 12, wherein there is a threshold value on the reference value (WRmn), below which a first quantification table is applied (TB1, TS1) and beyond which a second quantification table is applied (TB2, TS2).

14. The method according to claim 10, wherein according to whether the initial value to be processed belongs to one base layer (MSB) or another layer (MS1, MS2, MS3), one table (TB) or another table (TS) is used.

15. The method according to claim 1, wherein a quantification table (TB1, TB2, TS1, TS2) is applied to the difference (Dmn) between the initial value processed (Vmn) and the reference value, in order to calculate the compressed value (VCmn) and the restored value (VRmn).

16. The method according to claim 15, wherein according to whether the initial value to be processed belongs to one base layer (MSB) or another layer (MS1, MS2, MS3), one table (TB) or another table (TS) is used.

17. The method according to claim 1, wherein the initial matrix is of a dimension greater than or equal to 3.

18. The method according to claim 1, wherein the matrices are of two dimensions and when there are at least two possible reference values, on the same line (m), the other on the same column (n) for the value (Vmn) to be processed of the layer (MSB), the choice of the reference value is made by:

calculating a first variation (DVm) between the first potential reference value that has the same column number (n) as the value (Vmn) processed and the restored value having the same line number as this first potential reference value and the same column index as the second potential reference value; and, calculating the second variation (DVn) between the second potential reference value that has the same line index (m) as the value (Vmn) processed and the restored value that has the same column number as this second potential reference value and the same line number said first potential reference value; then, choosing the reference value for which the path of travel gives the lowest variation, i.e. the first reference value is chosen, on the same column (n), if the second variation (DVn) is less in absolute value than the first variation (DVm), or, the second reference value is chosen, on the same line (m), if the first variation (DVm) is less in absolute value than the second variation (DVn).

* * * * *